(12) United States Patent
Alam et al.

(10) Patent No.: US 9,735,894 B2
(45) Date of Patent: Aug. 15, 2017

(54) HIGH PERFORMANCE RECEIVER ARCHITECTURE AND METHODS THEREOF

(71) Applicant: Intel IP Corporation, Santa Clara, CA (US)

(72) Inventors: Mohammed Alam, Chandler, AZ (US); Patrick Rakers, Scottsdale, AZ (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/665,818

(22) Filed: Mar. 23, 2015

(65) Prior Publication Data

US 2016/0285567 A1 Sep. 29, 2016

(51) Int. Cl.
*H04B 1/26* (2006.01)
*H04B 15/02* (2006.01)
*H03D 7/14* (2006.01)

(52) U.S. Cl.
CPC ........... *H04B 15/02* (2013.01); *H03D 7/1441* (2013.01); *H03D 7/1458* (2013.01); *H03D 7/1466* (2013.01); *H03D 2200/0088* (2013.01)

(58) Field of Classification Search
CPC ...................................... H04B 15/02
USPC ....................................... 455/323
See application file for complete search history.

(56) References Cited

U.S. PATENT DOCUMENTS

| | | | |
|---|---|---|---|
| 5,678,222 A | 10/1997 | Hornak et al. | |
| 2006/0035611 A1* | 2/2006 | Connell | H03D 7/1441 455/209 |
| 2008/0284487 A1 | 11/2008 | Pullela et al. | |
| 2009/0252252 A1* | 10/2009 | Kim | H03D 7/163 375/268 |
| 2013/0135029 A1 | 5/2013 | Xu et al. | |
| 2016/0330049 A1* | 11/2016 | Roh | H04L 25/06 |

OTHER PUBLICATIONS

"European Application Serial No. 16154580.1, Extended European Search Report mailed Aug. 3, 2016", 7 pgs.

* cited by examiner

*Primary Examiner* — Sanh Phu
(74) *Attorney, Agent, or Firm* — Schwegman Lundberg & Woessner, P.A.

(57) ABSTRACT

A user equipment (UE), receiver and method are generally described herein. The UE may include a mixer, a local oscillator (LO) and an analog-to-digital converter (ADC). The mixer may downconvert a differential radio frequency (RF) signal using LO signals and provide downconverted signals to the ADC. The mixer may provide decoupled lowpass filtering. The lowpass filter capacitors may retain charge when discharging is completed. For each differential signal, the mixer may have an input pullup resistor, first switches receiving the signal and driven by different LO signals, second switches receiving signals from the first switches such that connected pairs of switches may have driven by different LO signals, an ADC input resistor, charging capacitors each connected between first switches driven by the same LO signal, and grounding capacitors each connected to second switches associated with different RF signal outputs and driven by different LO signals.

27 Claims, 6 Drawing Sheets

(12)  United States Patent
US 9,735,894 B2

HIGH PERFORMANCE RECEIVER ARCHITECTURE AND METHODS THEREOF

TECHNICAL FIELD

Embodiments pertain to wireless communication devices. Some embodiments relate to receivers and receiver architecture in wireless communication devices.

BACKGROUND

The use of wireless communications in everyday life has become ubiquitous. Information is transmitted wirelessly using a variety of different techniques on an increasing number of radio frequency (RF) bands. Communication devices typically convert between the RF signals and low frequency (LF) signals such as intermediate frequency (IF) signals or zero-frequency signals such as baseband signals as the components in the devices operate on the LF signals. In particular, during reception, the communication device typically receives and amplifies an RF signal before modulating the RF signal to an LF signal. The LF signal is then typically digitized and the digitized signals then being further processed by digital circuitry (e.g., microprocessors, digital signal processors, etc.).

The desired (in band) RF signals, however, are not the only RF signals present during processing. Blocker (out of band) signals also affect the components used to receive the signals. The out of band RF signals, for example, may be generated for transmission by the same communication device and leak into the receiver path. A typical receiver path contains, among other components, an amplifier that amplifies the RF signal, a mixer that converts the RF signal to an LF signal and an analog-to-digital converter (ADC) that converts the LF signal into digital data. The out of band RF signals cause a number of issues in an architecture in which the mixer is directly connected to the ADC, including degraded linearity and increased noise figure of the overall receiver.

What is desired is an improved receiver and method that addresses these issues.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

DETAILED DESCRIPTION OF THE INVENTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
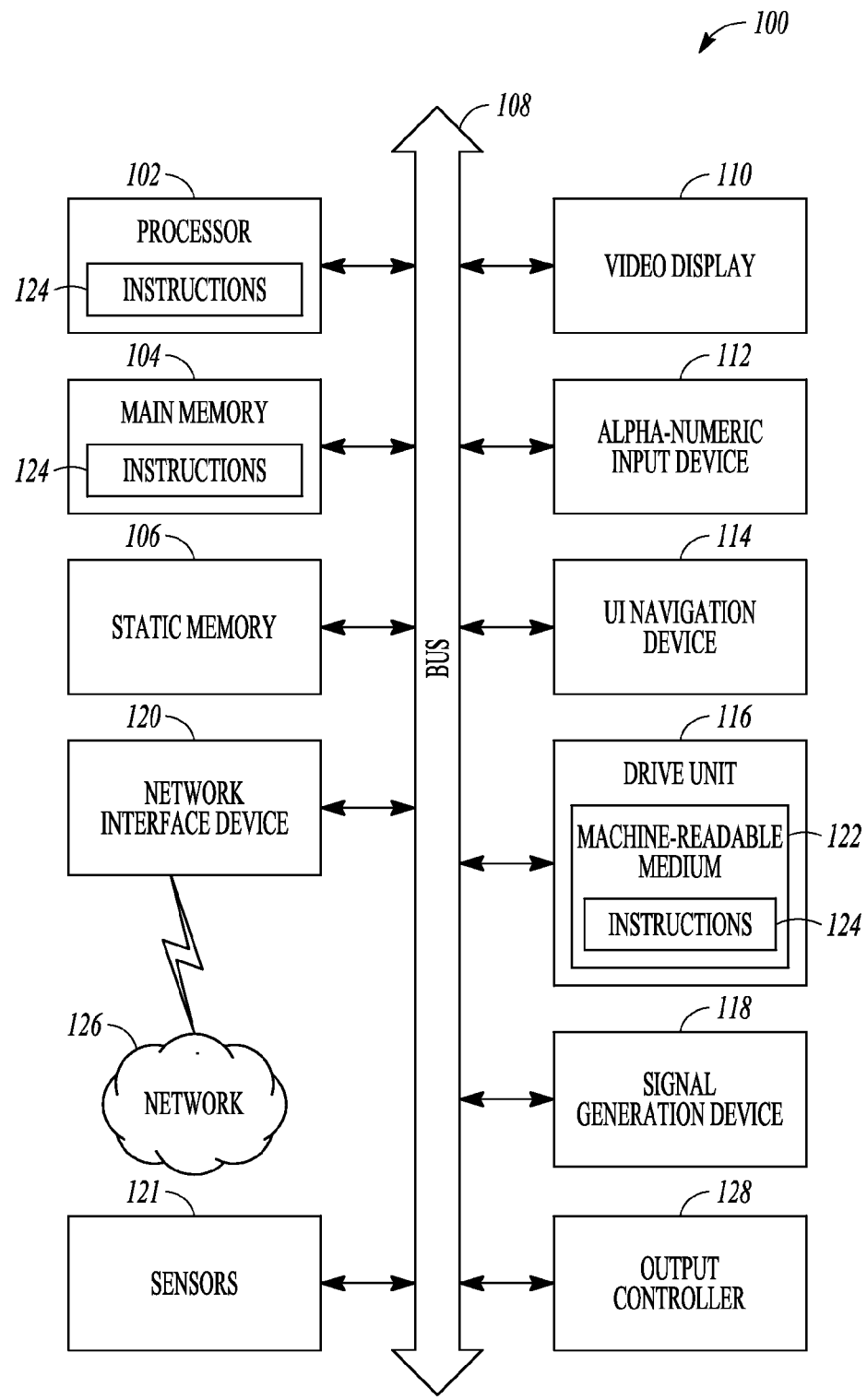
FIG. 1 is a functional diagram of a communication device in accordance with some embodiments.

FIG. 1 is a functional diagram of a communication device in accordance with some embodiments. In some embodiments the communication device 100 may be a computer configured to perform any one or more of the techniques (e.g., methodologies) discussed herein. The communication device 100 may be a personal computer (PC), a tablet PC, a set-top box (STB), a personal digital assistant (PDA), a mobile telephone, a smart phone, a web appliance, a network router, switch or bridge, a medical device (e.g., a heart rate monitor, a blood pressure monitor, etc.) or any machine capable of executing instructions (sequential or otherwise) that specify actions to be taken by the communication device 100.

Examples, as described herein, may include, or may operate on, logic or a number of components, modules, or mechanisms. Modules and components are tangible entities (e.g., hardware) capable of performing specified operations and may be configured or arranged in a certain manner In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" (and "component") is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Communication device 100 may include a hardware processor 102 (e.g., a central processing unit (CPU), a GPU, a hardware processor core, or any combination thereof), a main memory 104 and a static memory 106, some or all of which may communicate with each other via an interlink (e.g., bus) 108. The communication device 100 may further include a display unit 110, an alphanumeric input device 112 (e.g., a keyboard), and a user interface (UI) navigation device 114 (e.g., a mouse). In an example, the display unit 110, input device 112 and UI navigation device 114 may be a touch screen display. The computer 100 may additionally include a storage device (e.g., drive unit) 116, a signal generation device 118 (e.g., a speaker), a network interface device 120, and one or more sensors 121, such as a global positioning system (GPS) sensor, compass, accelerometer, or other sensor. The computer 100 may include an output controller 128, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 116 may include a machine readable medium 122 on which may be stored one or more sets of data structures or instructions 124 (e.g., software) embodying or utilized by any one or more of the techniques or functions described herein. The instructions 124 may also reside, completely or at least partially, within the main memory 104, within static memory 106, or within the hardware processor 102 during execution thereof by the computer 100. In an example, one or any combination of the hardware processor 102, the main memory 104, the static memory 106, or the storage device 116 may constitute machine readable media.

While the machine readable medium 122 is illustrated as a single medium, the term "machine readable medium" may include a single medium or multiple media (e.g., a centralized or distributed database, and/or associated caches and servers) configured to store the one or more instructions 124.

The term "machine readable medium" may include any medium that is capable of storing, encoding, or carrying instructions for execution by the computer 100 and that cause the computer 100 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine readable media may include non-transitory machine readable media. In some examples, machine readable media may include machine readable media that is not a transitory propagating signal. The term "transmission medium" shall be taken to include any intangible medium that is capable of storing, encoding or carrying instructions for execution by the computer 100, and includes digital or analog communications signals or other intangible medium to facilitate communication of such software.

The instructions 124 may further be transmitted or received over a communications network 126 using a transmission medium via the network interface device 120 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 120 may include one or more physical jacks (e.g., Ethernet, coaxial, or phone jacks) or one or more antennas to connect to the communications network 126. In an example, the network interface device 120 may include a plurality of antennas to wirelessly communicate using at least one of single-input multiple-output (SIMO), multiple-input multiple-output (MIMO), or multiple-input single-output (MISO) techniques. In some examples, the network interface device 120 may wirelessly communicate using Multiple User MIMO techniques. In some MIMO embodiments, the antennas may be effectively separated to take advantage of spatial diversity and the different channel characteristics that may result.

In one embodiment, the communication device 100 may be a User Equipment (UE) configured to communicate with a cellular network such as a network. The network may comprise a radio access network (RAN) (e.g., E-UTRAN or evolved universal terrestrial radio access network) and core network (e.g., an evolved packet core (EPC)) coupled together through an S1 interface. The core network includes mobility management entity (MME), serving gateway (serving GW), and packet data network gateway (PDN GW). The RAN includes Evolved Node-Bs (eNBs) (which may operate as base stations) for communicating with the UE 100. The eNBs may include macro eNBs and low power (LP) eNBs.

The MME may be similar in function to the control plane of legacy Serving GPRS Support Nodes (SGSN). The MME manages mobility aspects in access such as gateway selection and tracking area list management. The serving GW terminates the interface toward the RAN, and routes traffic packets (such as data packets or voice packets) between the RAN and the core network. In addition, it may be a local mobility anchor point for inter-eNB handovers and also may provide an anchor for inter-3GPP mobility. Other responsibilities may include lawful intercept, charging, and some policy enforcement. The serving GW and the MME may be implemented in one physical node or separate physical nodes. The PDN GW terminates an SGi interface toward the packet data network (PDN). The PDN GW routes traffic packets between the EPC and the external PDN, and may be a key node for policy enforcement and charging data collection. It may also provide an anchor point for mobility with non-LTE accesses. The external PDN can be any kind of IP network, as well as an IP Multimedia Subsystem (IMS) domain. The PDN GW and the serving GW may be implemented in one physical node or separated physical nodes.

The eNBs (macro and micro) terminate the air interface protocol and may be the first point of contact for the UE 100. In some embodiments, an eNB may fulfill various logical functions for the RAN including but not limited to RNC (radio network controller functions) such as radio bearer management, uplink and downlink dynamic radio resource management and traffic packet scheduling, and mobility management. In accordance with embodiments, UEs may be configured to communicate OFDM communication signals with an eNB over a multicarrier communication channel in accordance with an OFDMA communication technique. The OFDM signals may comprise a plurality of orthogonal subcarriers. Other technologies may also be used, such as Non-Orthogonal Multiple Access (NOMA), Code Division Multiple Access (CDMA), and Orthogonal Frequency-Division Multiple Access (OFDMA).

The S1 interface may be the interface that separates the RAN and the EPC. It may be split into two parts: the S1-U, which carries traffic packets between the eNBs and the serving GW, and the S1-MME, which may be a signaling interface between the eNBs and the MME.

In some embodiments, a downlink resource grid may be used for downlink transmissions from an eNB to the communication device 100, while uplink transmission from the communication device 100 to the eNB may utilize similar techniques. The grid may be a time-frequency grid, called a resource grid or time-frequency resource grid, which may be the physical resource in the downlink in each slot. Such a time-frequency plane representation may be a common practice for OFDM systems, which makes it intuitive for radio resource allocation. Each column and each row of the resource grid correspond to one OFDM symbol and one OFDM subcarrier, respectively. The duration of the resource grid in the time domain corresponds to one slot in a radio frame. The smallest time-frequency unit in a resource grid may be denoted as a resource element. Each resource grid comprises a number of resource blocks, which describe the mapping of certain physical channels to resource elements. Each resource block comprises a collection of resource elements and in the frequency domain, this represents the smallest quanta of resources that currently can be allocated. There are several different physical downlink channels that are conveyed using such resource blocks.

Figure 2:
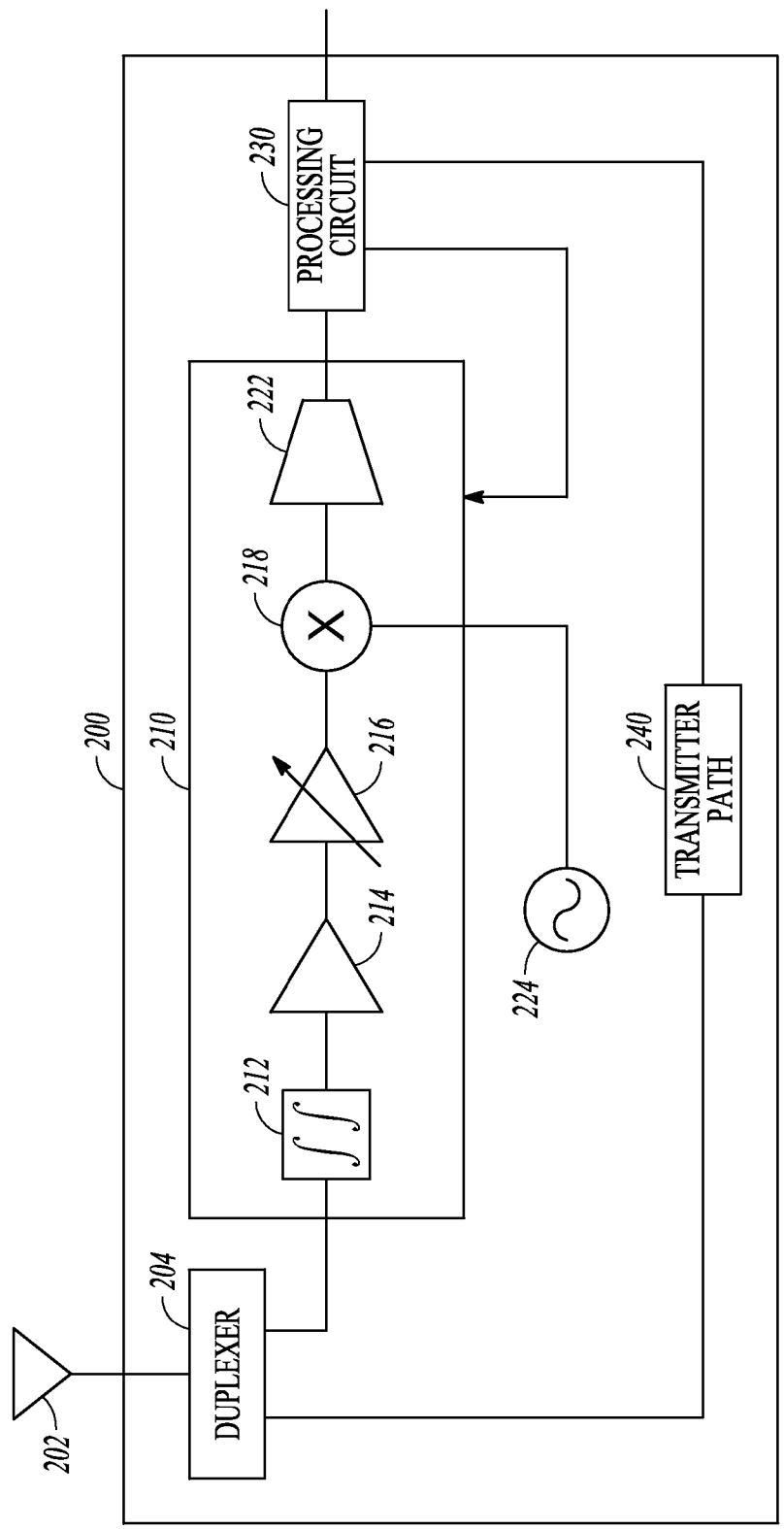
FIG. 2 is a block diagram of a communication device in accordance with some embodiments.

FIG. 2 is a block diagram of a communication device in accordance with some embodiments. The communication device 200 is simplified for convenience. The communication device 200 may include one or more antennae 202 for transmitting and receiving RF signals. For example, the RF signals received by antenna 202 may include Long Term Evolution (LTE) band 20, whose uplink frequency may be 832-862 MHz, downlink frequency may be 791-821 MHz, bandwidth may be 30 MHz, duplex spacing may be −40 MHz. Antenna 202 may comprise one or more directional or omnidirectional antennas, including, for example, dipole antennas, monopole antennas, patch antennas, loop antennas, microstrip antennas or other types of antennas suitable for transmission of RF signals.

In some embodiments, the antenna 202 may be connected with duplexer 204. Duplexer 204 determines whether signals are being received or transmitted by communication device 200 and selects the signal path accordingly. Specifically, duplexer 204 passes RF signals received by antenna 202 to receiver path 210 and passes signals from transmitter path 240 to antenna 202. Although in one embodiment duplexer 204 may be selective, i.e., only one path may be open at a time, receiver path 210 and transmitter path 240 may not be completely isolated, that may be RF signals can leak from one path to another. As receiver path 210 may be discussed herein, the components of transmitter path 240 are not described herein for simplicity.

Receiver path 210 may contain a number of components, one or more of which may not be present. For example, as shown, receiver path 210 may include filter 212, buffer 214, low noise amplifier (LNA) 216, mixer 218 and ADC 218. Other components, such as blocking capacitors, filters, buffers and other amplifiers may be present but are not shown for the sake of simplicity. As shown, the RF signal may be received by antenna 202 and transmitted through duplexer 204 to bandpass filter 212, where the RF signal may be filtered. The filtered signal may be then provided to buffer 214, where the signal may be buffered and then passed to LNA 216 where the signal may be amplified. LNA 216 is, in one embodiment, a variable amplifier whose amplification may be tuned as desired based on the received signal strength. The amplified RF signal from LNA 216 may be supplied to mixer 218, where the amplified RF signal may be mixed with a local oscillator (LO) signal down to an intermediate frequency (IF) or baseband signal. The LO signal may be generated by an LO 224 or synthesizer that feeds receiver path 210. To down convert the RF signal to an LF or baseband signal, mixer 218 receives the RF input signal as well as mixing frequency, and generates fundamental frequencies at a difference of the RF input signal and the mixing frequency LO signal ($f_{RF}-f_{LO}$) and a sum of the RF input signal and the mixing frequency LO signal ($f_{RF}+f_{LO}$) as well as harmonics of fundamental frequencies. The difference of the RF input signal and the mixing frequency LO signal may be the LF signal that may be provided to ADC 222 as a current. ADC 222 digitizes the LF signal and typically contains a multiple integrator stages. An input integrator stage may include an op-amp having one input held at virtual ground while the other input sinks the input current and may be provided capacitive feedback from the op-amp output. The signal from ADC 222 may be provided to further processing circuitry 230. Processing circuitry 230 provides further processing of the digitized received signals from receiver 210 and may provide feedback to components in receiver 210. Processing circuitry 230 also provides digitized output signals to transmitter path 240. In some embodiments, processing circuitry 230 may be a baseband processor. In some embodiments, ADC 222 may be part of processing circuity 230. In these embodiments, receiver 210 may be configured to provide an analog baseband signal to processing circuitry 230, although the scope of the embodiments is not limited in this respect.

Figure 3:
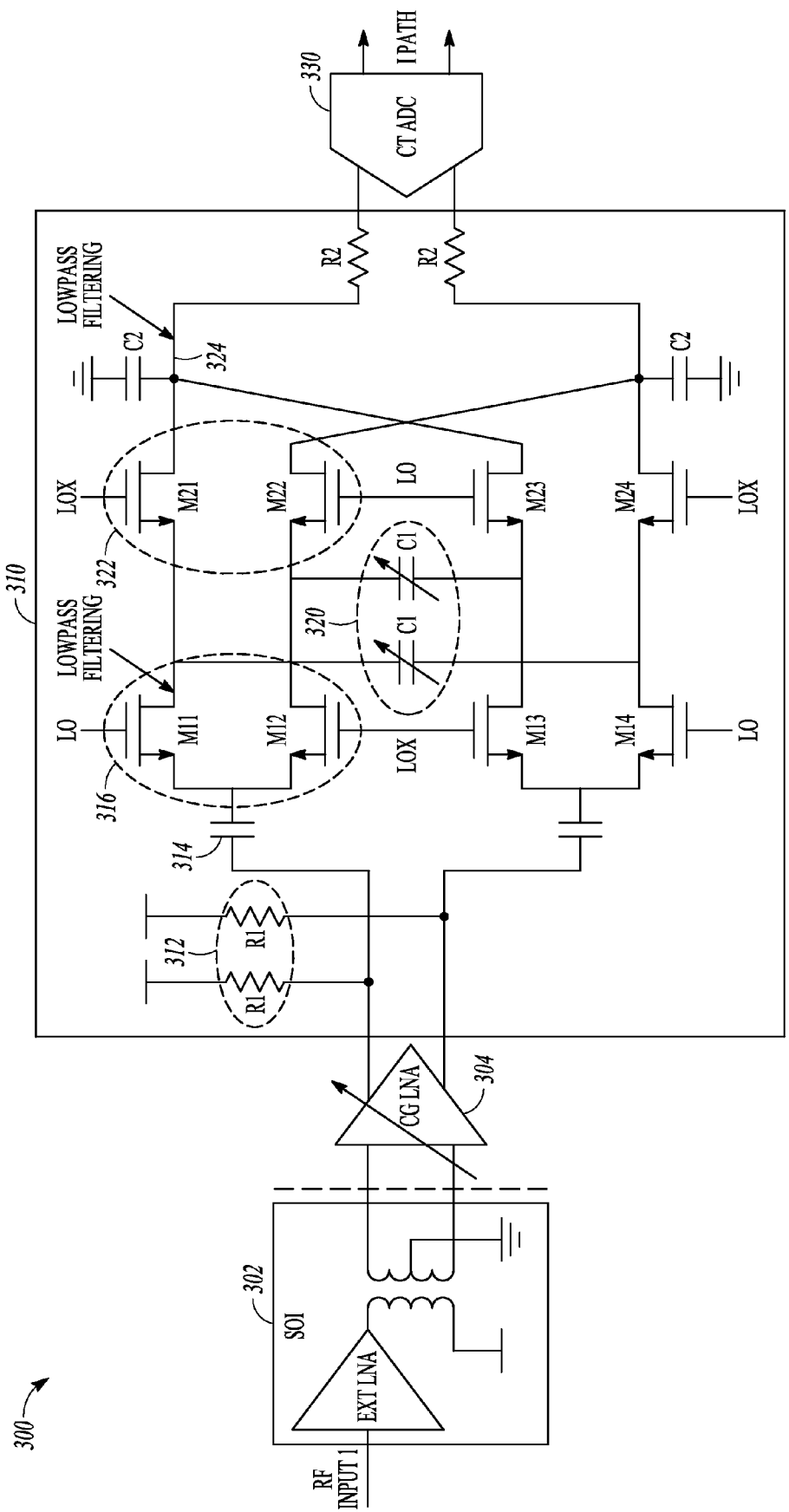
FIG. 3 is a circuit diagram of a receiver path in accordance with some embodiments.

FIG. 3 illustrates a circuit diagram of a receiver path in accordance with some embodiments. The receiver may be a current mode receiver. Thus, as shown FIG. 3, differential RF signals may be used to provide information. Moreover, an RF signal received by the receiver may be converted into an in-phase (I) component and a quadrature (Q) component. The I and Q components have the same frequency but may be 90° out of phase with each other. For simplicity, only the I component path of current mode receiver 300 is shown as the Q component path of current mode receiver 300 essentially duplicates that shown in FIG. 3.

As illustrated in FIG. 3, an RF signal (such as received by an antenna of the communication device of which receiver 300 is a part and perhaps further processed) may be supplied to preamplifier module 302. Preamplifier module 302 transforms the RF signal into a differential signal and supplies the differential RF signal to variable gain LNA 304. Preamplifier module 302 and LNA 304 convert an RF voltage signal to an RF current signal (herein after merely referred to as an RF signal). The outputs of LNA 304 may be supplied to differential inputs of mixer 310. Mixer 310 has pullup resistors $R_L$, 312, each of which may be connected between one of the inputs of mixer 310 and the power supply (not shown) that supplies power to receiver 300. In one embodiment, pullup resistor $R_L$ 312 may be about 300Ω. Similarly, each of the inputs of mixer 310 may be connected to a pair of first switches 316. The inputs of mixer 310 may be connected to inputs of the pair of first switches 316 through coupling capacitor 314. As shown in FIG. 3, there may be two pairs of first switches 316.

In one embodiment, each of the switches shown in FIG. 3 may be implemented using metal-oxide semiconductor field-effect transistors (MOSFETs). As is well known, a MOSFET has terminals (source and drain) that are connected via a channel through the MOSFET. The MOSFET channel is controlled by applying a signal to the gate. The gate of the MOSFET is driven using an LO signal. When the MOSFET is on (the channel is open), the RF signal passes through the MOSFET, being transferred from one terminal to another. When the MOSFET is off (the channel is closed), the RF signal does not pass through the MOSFET. In other embodiments, other types of transistors (other FETs, bipolar junction, etc . . . ) may be used.

Each switch in a pair of the first switches 316 may be driven by different LO signals (as shown, LO and LOX). The LO signals can differ in duty cycle (the percentage of one period in which the LO signal is high) and/or offset (the difference between start points of the period). In one embodiment, the different LO signals have a 25% duty cycle and a 50% offset. Thus, in this case when one LO signal is high, the other is low. In addition, there may be times such as that provided in which both LO signals may be low. In other embodiments, other duty cycles and/or offsets may be chosen.

Outputs of each pair of first switches 316 may be connected to inputs of a pair of second switches 322. Specifically, the output of a first switch of a pair of the first switches 316 may be connected with an input of a first switch of a pair of the second switches 322. The first switch of the pair of the first switches 316 and the first switch of the pair of the second switches 322 may be driven by the different LO signals. Thus, given the above embodiment in which the different LO signals have a 25% duty cycle and a 50% offset, when one of the first switch of the pair of the first switches 316 and the first switch of the pair of the second switches 322 is on, the other of the first switch of the pair of the first switches 316 and the first switch of the pair of the second switches 322 is off. Similarly, the output of a second switch of the pair of the first switches 316 is connected with an input of a second switch of the pair of the second switches 322. The second switch of the pair of the first switches 316 and the second switch of the pair of the second switches 322 may be driven by the different LO signals. Thus, as above, when one of the second switch of the pair of the first switches 316 and the second switch of the pair of the second switches 322 is on, the other of the second switch of the pair of the first switches 316 and the second switch of the pair of the second switches 322 is off.

In addition, the output of the first switch of one of the pairs of the first switches 316 and the output of the second switch of the other of the pairs of the first switches 316 may be connected together through a variable capacitor 320. Thus, as seen in FIG. 3, each variable capacitor 320 may be connected to the outputs of switches that may be driven by the same LO signal and the variable capacitors 320 may be connected between the outputs of switches that may be driven by the opposite phase of LO signals. The capacitance of variable capacitor 320 may be set, for example, up to about 100 pF but this value may be adjusted dependent on the frequency band of the RF signal being received. For example, at 2 MHz, the capacitance of variable capacitor 320 may be set at about 100 pF, while at 45 MHz, the capacitance of variable capacitor 320 may be reduced. Note that variable capacitor 320 may be formed from a series of individual capacitors, some of which may be automatically trimmed (switched off) by a processor of the communication device depending on the technology mode (e.g., 4G LTE, GSM, etc . . . ) and band in which the communication device may be operating. LF the band and/or mode changes, the processor can readjust which capacitors may be trimmed. The capacitors may be in parallel and have the same capacitance or the capacitance may vary among the individual capacitors.

The outputs of each pair of second switches 322 may be each connected to ground through a different grounding capacitor 324. Thus, as can be seen in FIG. 3, the outputs of a first switch of each pair of the second switches 322, which may be driven by different LO signals, may be connected to ground through the same grounding capacitor 324 and the outputs of a second switch of each pair of the second switches 322, which may be also driven by different LO signals, may be connected to ground through the same grounding capacitor 324. The capacitance of grounding capacitor 324 may be, for example, nominally about 10 pF, although the scope of the embodiments is not limited in this respect.

The outputs of each pair of second switches 322 may be also each connected to a different differential input of ADC 330 through ADC input resistor 326. The resistance of ADC input resistor 326 may be, for example, 50-100Ω. The differential current flowing into ADC 330 through ADC input resistors 326 allows ADC 330 to digitize the down-converted RF current. The RF signal may be thus down-converted in frequency to an intermediate frequency (IF) or baseband signal by mixer 300 prior to being supplied to the inputs of ADC 330 and digitized.

Because first and second switches whose output and input may be connected together may be driven by different LO signals, variable capacitors 320 alternately charge and discharge independently. In operation, when each first switch is open, the corresponding variable capacitor 320 charges. The capacitance of variable capacitor 320 and the resistance of pullup resistor $R_L$ 312 form a pole, as does the combination of grounding capacitor 324 and ADC input resistor 326. For LO signals having a 25% duty cycle and a 50% offset, only one of the variable capacitors charges at a time—the other remains in a steady state until discharging. Similarly, only one of the variable capacitors discharges at a time—the other remains in a steady state. In one embodiment, the LO duty cycle and time constant formed by the capacitance of variable capacitor 320 and the resistance of pullup resistor $R_L$ 312 may be set such that during discharging variable capacitor 320 does not completely discharge. In other embodiments, the LO duty cycle and time constant may be set such that variable capacitor 320 completely discharges, similar to a switch cap circuit.

In one embodiment, the combination of the poles may be sufficient to provide at least about 6 dB of attenuation for a Long Term Evolution (LTE) band 20 blocker signal at 36.68 MHz. This reduces component issues caused by blockers when mixed with the desired RF signal generally as the desired signal may be not reduced appreciably. Specifically, when an undesired blocker may be present at the input of the mixer, it may be converted into an LF current along with the desired received RF signal. Because the ADC may be coupled directly to the mixer, when the undesired RF blocker may be mixed by the mixer with the desired signal, the current drain of the input integrator stage of the ADC increases to sink the additional blocker LF current. The concurrent increase in input impedance of the op-amp from the increased current drain results in a signal swing at the virtual ground. As the virtual ground may be no longer held constant, the linearity of the ADC and mixer degrades, in turn increasing the noise figure of the receiver. However, as a result of adding the pole to the mixer, the LF current caused by the blocker and provided to the ADC for the ADC to sink may be reduced or eliminated, thereby reducing the current drain of the ADC. This reduces the signal swing at the virtual ground of the input stage of the ADC, thereby improving the linearity and the noise figure of the receiver as shown in the simulations below.

In an equivalent circuit of the mixer, the RF signal provided by LNA may be a constant current source with current $i_{RF}$ that may be in parallel with load resistor $R_L$. First switch, when closed (turned on), connects load resistor $R_L$ with the variable capacitor C, which is shown in combination as having a combined capacitance of twice the value of the individual variable capacitors. As shown, when LO is high, current $i_c$ flows across first switch, charging the variable capacitor, while the second switch remains open. The variable capacitor remains charged until the second switch 322 is closed, when LOX is high. When LOX is high, the variable capacitor discharges across first switch, with current $i_{if}$ flowing to the parallel combination of ADC input resistor R2 and grounding capacitor C2.

Figure 4A:
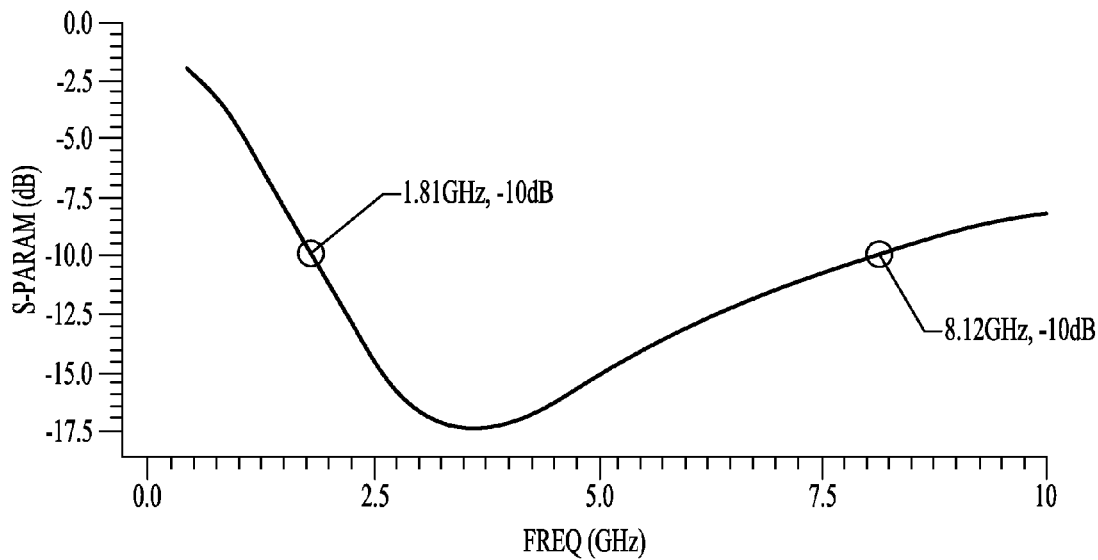
FIGS. 4A-4D illustrate plots of simulations in accordance with some embodiments.
Figure 4B:
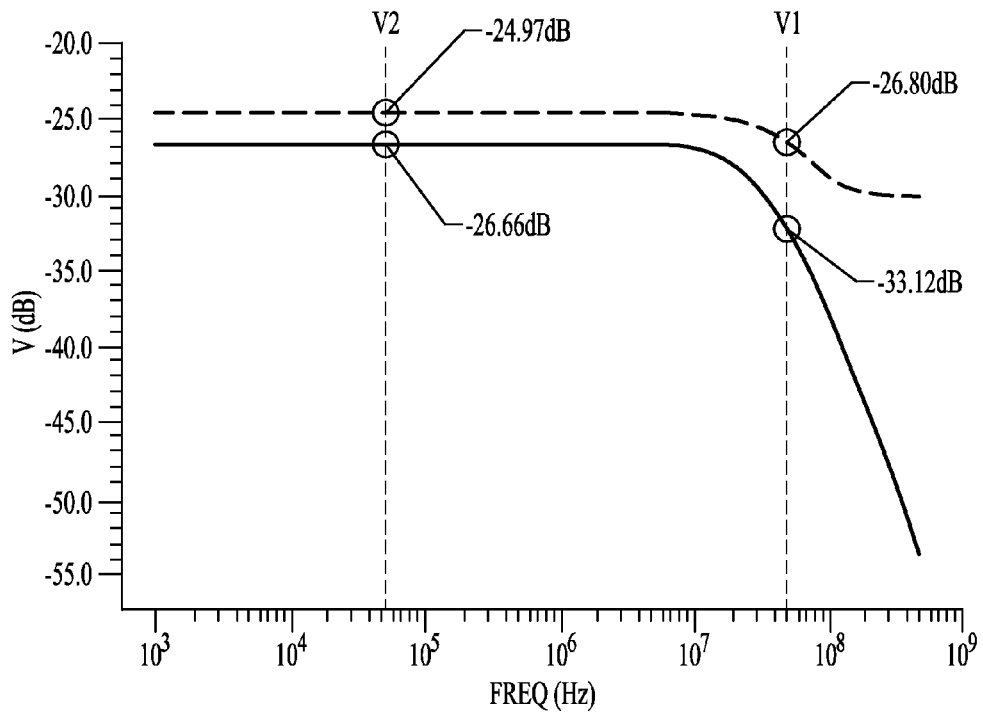
Figure 4C:
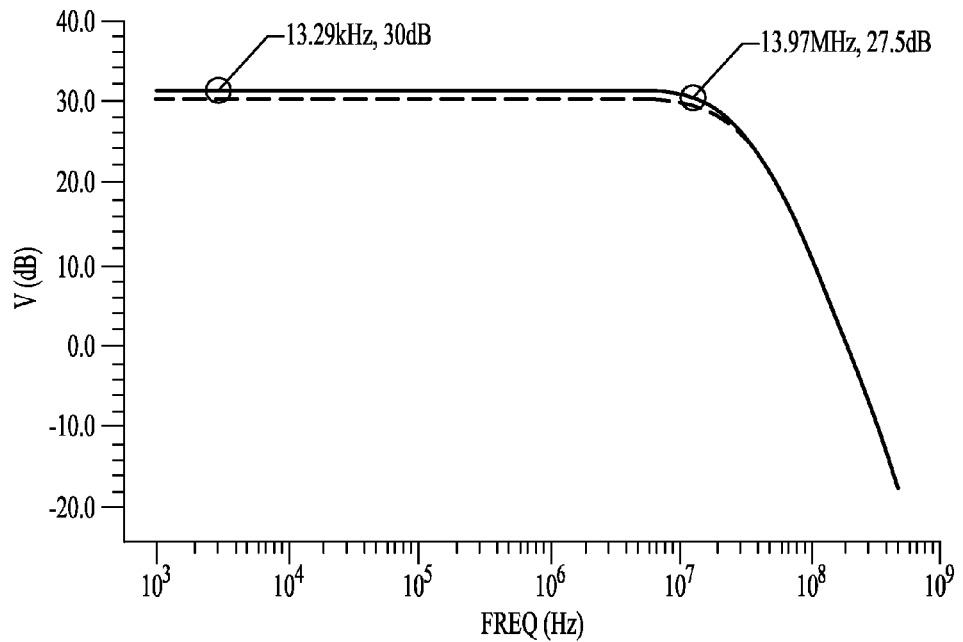
Figure 4D:
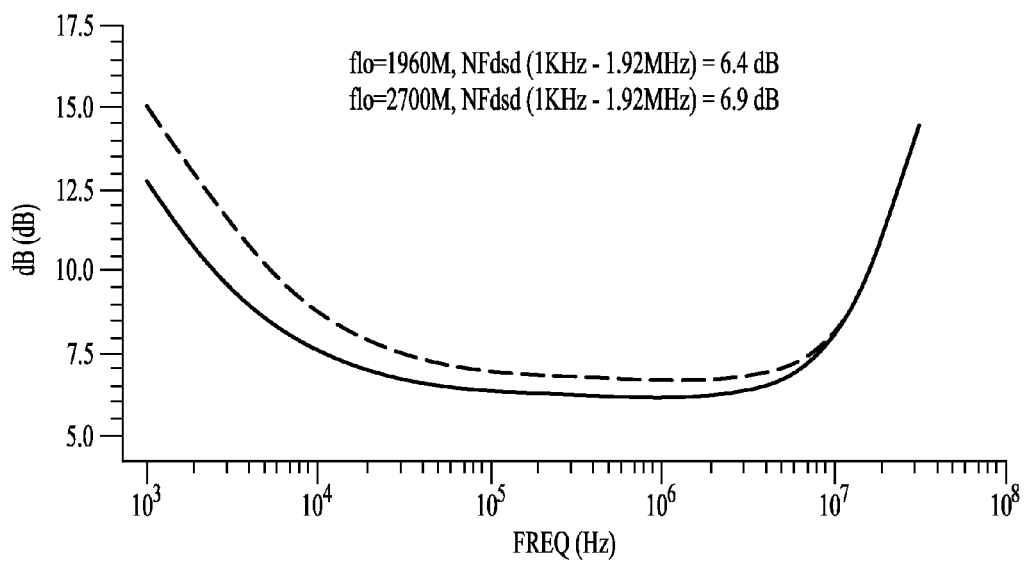

FIGS. 4A-4D illustrate plots of simulations in accordance with some embodiments. The simulation in FIG. 4A shows the S11 (reflection) parameter looking into LNA 304. As can be seen, the S11 parameter remains almost unchanged over an extremely wide bandwidth of received signal (>6 GHz). In other words, the S11 parameter may be virtually unaffected by mixer 310. The simulation in FIG. 4C shows the response of the mixer (bottom trace) compared with a conventional mixer (top trace). The simulation of FIG. 4C indicates that the frequency response appears flat in the conventional mixer and the frequency response appears similar to the single pole present for the new mixer. The rolloff at higher frequencies may be faster, increasing from about a 2.7 dB attenuation difference at 10 MHz to about 6.4 dB difference at about 50 MHz, resulting in about a 3.7 dB faster rolloff over the 40 MHz range. Of course, LF a larger resistor or variable capacitance may be used, the pole location can be changed. In the simulation of FIG>4B, the pole frequency of the mixer may be essentially independent of the LO frequency, remaining virtually unchanged between LO frequencies of 1.97 GHz and 2.7 GHz. Similarly, the simulation in FIG. 4D shows that the noise figure of the mixer as a function of the LO frequency remains almost the same. In particular, as shown, the noise figure changes only about 0.5 dB between LO frequencies of 1.97 GHz (NF=6.4 dB) and 2.7 GHz (NF=6.9 dB) for frequencies between 1 kHz and 1.92 MHz.

Figure 5:
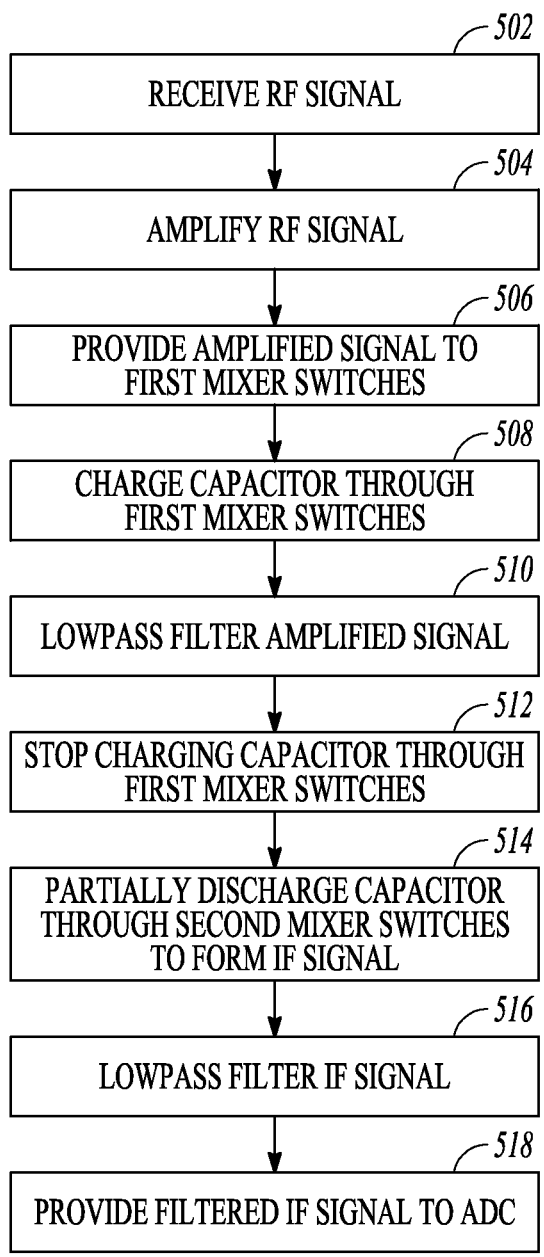
FIG. 5 illustrates a flowchart of a method of receiving a signal in accordance with some embodiments.

FIG. 5 illustrates a flowchart of a method of receiving a signal in accordance with some embodiments. In some embodiments, the communication device of FIG. 3 may be configured to perform procedure 500, although the scope of the embodiments is not limited in this respect as other communication devices and configurations can be configured to perform procedure 500.

The method begins at step 502, when an RF signal is received. In one embodiment, the RF signal may be received at the communication device shown in FIG. 3. In one embodiment, the RF signal may be received by the one or more antennae using a SIMO, MIMO, or MISO technique.

The RF signal may then be amplified at step 504. In one embodiment, the RF signal may be amplified by a differential LNA. The LNA may be fixed gain or variable gain. If a variable gain LNA is used to amplify the RF signal, the gain may be set by a controller using feedback from an output of the communication device.

Each output of the differential amplified RF signal may be provided to first switches of a mixer at step 506. The first switches may be MOSFETs, for example. The first switches may be driven by different LO signals. The output of the amplified RF signal may be provided to the first switches through a capacitor. A pullup resistor may be connected to the capacitor.

Each of the first switches may be closed at step 508, thereby permitting current to flow through the first switches. In one embodiment, a charging capacitor may be disposed between pairs of the first switches. In one embodiment, the charging capacitor may be disposed between the first switches driven by the same LO signal. In one embodiment, the capacitor may be a variable capacitor.

In one embodiment, the signal passing through the first switches may also be lowpass filtered at step 510 while the variable capacitor is charging. In one embodiment, the lowpass filter may be formed by the pullup resistor and the combination of the capacitor at the input of the first switches and the variable capacitor.

In one embodiment, the charging of the variable capacitor is subsequently stopped at step 512 when the first switches are open. In one embodiment, the variable capacitors between first switches may be charged at different times due to being driven by the different LO signals.

The variable capacitor subsequently may begin to discharge at step 514 when second switches are closed, thereby forming an LF signal from the RF signal. In one embodiment, the variable capacitors between first switches may be discharged at different times due to being driven by the different LO signals. In one embodiment, the second switches may be connected to the first switches such that first and second switches that are connected may be driven by the different LO signals. In one embodiment, the different LO signals are selected such that the first and second switches are not both closed at the same time, i.e., there is no overlap between charging and discharging.

While the variable capacitor is discharging, the LF signal is also lowpass filtered at step 516. In one embodiment, outputs of the second switches of different pairs that are driven by the different LO signals may be connected with a grounding capacitor. In one embodiment, the lowpass filter may be provided as a combination of the variable and grounding capacitors and an input resistor of an ADC.

In one embodiment, the variable capacitor continues to discharge until the second switches are opened. In one embodiment, the variable capacitor may be only partially discharged. During discharge, in one embodiment, the lowpass filtered LF signal may be provided to the ADC at step 518.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept LF more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A receiver comprising:
a mixer configured to downconvert a radio frequency (RF) signal; and
a local oscillator (LO) configured to provide LO signals to the mixer,
wherein the mixer comprises:
a plurality of capacitors and a plurality of resistors that form a plurality of poles, and
pairs of switches, different capacitors of the plurality of capacitors are disposed between and couple together different pairs of the switches,
wherein the plurality of capacitors comprise a pair of grounding capacitors connected to ground, each of the grounding capacitors disposed between one pair of the switches and an output resistor,
wherein the plurality of resistors comprise pullup resistors cofigured to receive a differential mixer input signal,
wherein the plurality of poles is configured to provide decoupled lowpass filtering of a number of signals that pass through the mixer,
wherein the plurality of capacitors forms at least one lowpass filter to perform the lowpass filtering, the at least one lowpass filter configured to retain at least some charge when discharging of the at least one lowpass filter is completed during transfer of the downconverted RF signal through the mixer, and
wherein the plurality of poles comprises a first pole that is dependent on the pullup resistors, duty cycles of the LO signals and the charging capacitors and a second pole that is dependent on a combination of the output resistors, the capacitors between the pairs of switches, and the grounding capacitors.

2. A receiver comprising:
a mixer configured to downconvert a radio frequency (RF) signal; and
a local oscillator (LO) configured to provide LO signals to the mixer;
wherein the mixer comprises a plurality of capacitors and a plurality of resistors that form a plurality of poles, the mixer further comprising pairs of switches, different capacitors disposed between and coupling together different pairs of the switches, wherein the plurality of poles are configured to provide decoupled lowpass filtering of a number of signals that pass through the mixer, wherein the plurality of capacitors form at least one lowpass filter to perform the lowpass filtering, the at least one lowpass filter configured to retain at least some charge when discharging of the at least one lowpass filter is completed during transfer of the downconverted RF signal through the mixer, wherein the mixer comprises a differential mixer input and is configured to receive a differential mixer input signal; and
wherein the mixer further comprises for each signal of the differential mixer input signal:
a pullup resistor configured to receive the differential mixer input signal, a first pair of the switches configured to receive the differential mixer input signal and configured to be driven by different LO signals, a second pair of the switches configured to receive signals from the first pair of switches such that connected pairs of switches of the first and second pair of switches are configured to be driven by the different LO signals, and an output resistor configured to receive signals from the second pair of switches and to provide one signal of a differential output signal.

3. The receiver of claim 2, wherein the mixer further comprises:
a pair of charging capacitors disposed between the first and second pairs of switches, each of the charging capacitors connected between switches of the first pair of switches configured to be driven by the same LO signal such that the charging capacitors are configured to be discharged at different times and retain at least some charge when discharging is completed, and a pair of grounding capacitors disposed between the second pair of switches and the output resistors, each grounding capacitor connected between ground and switches of the second pair of switches associated with different RF signal outputs and configured to be driven by the different LO signals.

4. The receiver of claim 3, wherein the poles include a first pole that is dependent on the pullup resistors, duty cycles of the LO signals and the charging capacitors and a second pole that is dependent on a combination of the output resistors, the capacitors between the first and second pairs of switches, and the grounding capacitors.

5. The receiver of claim 4, wherein the duty cycles of the LO signals are configured such that when in operation the charging capacitors do not completely discharge.

6. The receiver of claim 5, wherein the LO signals each have a 25% duty cycle and are offset by 50% of a cycle of the LO signals.

7. The receiver of claim 2, wherein the switches of the first and second pair of switches each comprise metal-oxide-semiconductor field effect transistors.

8. The receiver of claim 3, wherein the charging capacitors are variable capacitors whose values are configured to be adjusted based on a frequency range of the RF signals.

9. The receiver of claim 2, further comprising a variable low noise amplifier (LNA) configured to receive the RF signal from the antenna and to provide amplified signals to the mixer.

10. The receiver of claim 2, wherein the lowpass filters are configured to provide at least about 6 dB of attenuation for a Long Term Evolution (LTE) band 20 blocker signal at 36.68 MHz.

11. The receiver of claim 2, further comprising:
an antenna configured to receive the RF signal and provide the RF signal.

12. A method of providing a higher performance receiver, the method comprising:
downconverting and lowpass filtering a radio frequency (RF) signal with a plurality of charging capacitors by retaining at least sonic charge on the charging capacitors when discharging of the charging capacitors is completed, and wherein the downconverted signal comprising a low frequency (LF) signal;
lowpass filtering the LF signal; and
digitizing the filtered LF signal.

13. The method of claim 12, wherein lowpass filtering and downconverting the RF signal comprises:
providing a first current of a differential output o a first pullup resistor and an input of each of a pair of first switches;
providing a second current of the differential output to a second pullup resistor and an input of each of a pair of second switches;
driving each pair of first switches with different local oscillator (LO) signals;
driving each pair of second switches with the different LO signals;
charging a first of the charging capacitors, the first charging capacitor connected between outputs of the first and second switches driven using a first of the LO signals; and
charging a second of the charging capacitors, the second charging capacitor connected between outputs of the first and second switches driven a second of the LO signals.

14. The method of claim 13, wherein lowpass filtering and downconverting the RF signal further comprises:
providing an output of the first switches to an input of a third pair of switches;
providing an output of the second switches to an input of a fourth pair of switches;
driving each pair of third switches with the different LO signals to discharge the first charging capacitor such that the first charging capacitor is configured to retain at least some charge when discharging is completed; and
driving each pair of fourth switches with the different LO signals to discharge the second charging capacitor such that the second charging capacitor is configured to retain at least some charge when discharging is completed.

15. The method of claim 14, wherein lowpass filtering and downconverting the RF signal further comprises:
coupling an output of a first of the third switches and a first of the fourth switches to ground through a first grounding capacitor and to a first output of a differential output through a first output resistor, the first of the third switches and the first of the fourth switches driven using the different LO signals; and
coupling an output of a second of the third switches and a second of the fourth switches to ground through a second grounding capacitor and to a second output of a differential output through a second output resistor, the second of the third switches and the second of the fourth switches driven using the different LO signals.

16. The method of claim 15, wherein the first and second pullup resistors have a first resistance, the first and second input resistors have a second resistance, the first and second charging capacitors have a first capacitance and the first and second grounding capacitors have a second capacitance.

17. The method of claim 15, wherein further comprising adjusting a value of each of the first and second charging capacitors dependent on a frequency range of the received RF signals.

18. The method of claim 15, wherein the first and second charging capacitors and first and second pullup resistors form a first pole and the first and second grounding capacitors, the first and second charging capacitors, and first and second input resistors form a second pole.

19. The method of claim 15, wherein the LO signals are configured to drive the first, second, third and fourth pair of switches such that each connected pair of the first and third pair of switches are driven mutually exclusively and each connected pair of the second and fourth pair of switches are driven mutually exclusively and the first and second charging capacitors are charged by the RF current without the RF current being provided to the outputs of the third and fourth pair of switches.

20. The method of claim 19, wherein the LO signals each have a 25% duty cycle and are offset by 50% of a cycle of the LO signals.

21. The method of claim 19, further comprising coupling the inputs of the first pair of switches to the first pullup resistor through a first coupling capacitor and the inputs of the second pair of switches to the second pullup resistor through a second coupling capacitor.

22. A user equipment (UE) comprising:
a mixer configured to convert a radio frequency (RF) signal to a low frequency (LF) signal; and
processing circuitry configured to enable the UE to receive the RF signal from an evolved Node-B (eNB) and process the LF signal using the mixer, wherein the mixer comprises a plurality of lowpass filters configured to perform lowpass filtering during conversion of the RF signal to the LF signal, at least one of the plurality of lowpass filters comprising a plurality of charging capacitors configured to retain at least some charge when discharging of the charging capacitors is completed, and the mixer comprises sets of switches between which are disposed and coupled together by capacitors of one of the lowpass filters.

23. The UE of claim 22, wherein:
the capacitors configured to be isolated from a differential output resistor pair when charging and connected to the differential output resistor pair when discharging, the capacitors configured to only partially discharge when connected to the differential output resistor pair before being isolated from the differential output resistor pair.

24. The receiver of claim 1, wherein:

the different capacitors are disposed between a first pair of the switches driven by a first of the LO signals and a second pair of the switches driven by a second of the LO signals.

25. A receiver comprising:

a mixer configured to downconvert a radio frequency (RF) signal, the mixer comprising switches, a first set of capacitors, a second set of capacitors, and a plurality of resistors, wherein each of the first set of capacitors is disposed between and couples together different sets of the switches, wherein the first and second set of capacitors and the plurality of resistors form a plurality of poles configured to provide decoupled lowpass filtering of signals that pass through the mixer, and wherein at least one lowpass filter of the first set of capacitors is configured to retain at least some charge when discharging of the at least one lowpass filter is completed during transfer of the downconverted RF signal through the mixer.

26. The receiver of claim 25, wherein:

the first set of capacitors are free from a connection to ground, and the second set of capacitors are connected to the ground.

27. The receiver of claim 25, wherein:

each of the first set of capacitors is connected with each of the second set of capacitors through a different one of the switches.

* * * * *

UNITED STATES PATENT AND TRADEMARK OFFICE
CERTIFICATE OF CORRECTION

PATENT NO. : 9,735,894 B2  
APPLICATION NO. : 14/665818  
DATED : August 15, 2017  
INVENTOR(S) : Alam et al.

Page 1 of 1

It is certified that error appears in the above-identified patent and that said Letters Patent is hereby corrected as shown below:

In Column 11, Line 61, in Claim 1, delete "cofigured" and insert --configured-- therefor In Column 13, Line 29, in Claim 12, delete "sonic" and insert --some-- therefor In Column 13, Line 37, in Claim 13, delete "o" and insert --to-- therefor Signed and Sealed this
First Day of May, 2018

Andrei Iancu
*Director of the United States Patent and Trademark Office*